(12) United States Patent
Kaneto et al.

(10) Patent No.: US 9,614,125 B2
(45) Date of Patent: Apr. 4, 2017

(54) COMPOSITE ELEMENT CHIP, A SEMICONDUCTOR DEVICE AND MANUFACTURING METHOD THEREOF, A PRINTING HEAD, AND AN IMAGE FORMING APPARATUS

(71) Applicant: Oki Data Corporation, Tokyo (JP)

(72) Inventors: Taishi Kaneto, Tokyo (JP); Takahito Suzuki, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 14/673,771

(22) Filed: Mar. 30, 2015

(65) Prior Publication Data
US 2015/0280067 A1    Oct. 1, 2015

(30) Foreign Application Priority Data

Mar. 31, 2014 (JP) ................. 2014-072759

(51) Int. Cl.
| | |
|---|---|
| G03G 15/04 | (2006.01) |
| H01L 33/24 | (2010.01) |
| H01L 25/075 | (2006.01) |
| H01L 25/16 | (2006.01) |
| B41J 2/45 | (2006.01) |
| H01L 27/15 | (2006.01) |

(52) U.S. Cl.
CPC .......... *H01L 33/24* (2013.01); *B41J 2/45* (2013.01); *G03G 15/04054* (2013.01); *H01L 25/0753* (2013.01); *H01L 25/167* (2013.01); *H01L 27/156* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,119,171 A | 6/1992 | Lesk et al. | |
| 6,163,036 A | 12/2000 | Taninaka et al. | |
| 2001/0002139 A1 | 5/2001 | Hiraoka | |
| 2004/0089939 A1* | 5/2004 | Ogihara | B41J 2/45 257/690 |

(Continued)

FOREIGN PATENT DOCUMENTS

JP    2004-207323 A    7/2004

*Primary Examiner* — David Gray
*Assistant Examiner* — Thomas Giampaolo, II
(74) *Attorney, Agent, or Firm* — Rabin & Berdo, P.C.

(57) ABSTRACT

A composite element chip includes a substrate; and a plurality of semiconductor thin-films disposed on the substrate and arranged in a predetermined direction which is a first direction. Each semiconductor thin-film includes an array of a plurality of light emitting portions which are arranged so that adjacent light emitting portions are displaced from each other by a predetermined distance in a second direction which is perpendicular to the first direction, the plurality of light emitting portions being arranged along an imaginary line. Each semiconductor thin-film has a first end that is parallel to the second direction; and a second end that extends along a pattern in which the plurality of light emitting portions are arranged and is parallel to the imaginary line. A semiconductor device and manufacturing method thereof, a printing head, and an image forming apparatus are also disclosed.

10 Claims, 13 Drawing Sheets

(56) References Cited

U.S. PATENT DOCUMENTS

| | | | |
|---|---|---|---|
| 2004/0090515 A1* | 5/2004 | Matsushiro | B41J 2/45 347/130 |
| 2008/0024849 A1* | 1/2008 | Hayashi | B82Y 20/00 359/204.1 |
| 2009/0067882 A1* | 3/2009 | Kuribayashi | G03G 15/326 399/220 |
| 2009/0206357 A1* | 8/2009 | Ito | H01L 33/38 257/99 |
| 2010/0237772 A1* | 9/2010 | Sakai | B41J 2/45 313/504 |
| 2013/0208026 A1* | 8/2013 | Suzuki | H01L 33/36 345/690 |

* cited by examiner

COMPOSITE ELEMENT CHIP, A SEMICONDUCTOR DEVICE AND MANUFACTURING METHOD THEREOF, A PRINTING HEAD, AND AN IMAGE FORMING APPARATUS

BACKGROUND OF THE INVENTION

The present invention relates to a light emitting element array, a semiconductor device, a manufacturing method thereof, a printing head, and an image forming apparatus. The present invention is applicable to, for example, an electrophotographic image forming apparatus such as a printer.

A conventional semiconductor device capable of emitting light is constituted by an optical semiconductor element array chip bonded to a semiconductor integrated circuit substrate having electrode terminals. The optical semiconductor element array chip and the semiconductor integrated circuit substrate are connected using wires (see, Japanese Application Publication No. 2004-207323).

In the conventional semiconductor device, it is necessary to provide bonding pads for bonding the wires. Therefore, it is difficult to reduce sizes of the optical semiconductor element array chip and the semiconductor integrated circuit substrate.

In order to solve this problem, Japanese Application Publication No. 2004-207323 discloses a semiconductor device in which a semiconductor thin-film layer including at least one optical semiconductor element is bonded to a planarized region on a surface of a semiconductor integrated circuit substrate. The optical semiconductor element is electrically connected to electrode terminals of the semiconductor integrated circuit substrate by photolithographic process. With such a configuration, regions for the bonding pads can be eliminated, and a chip width can be reduced. Therefore, a material of the semiconductor element (herein referred to as a semiconductor element material) such as GaAs or AlGaAs can be saved, and manufacturing cost can be reduced.

However, since the semiconductor element material such as GaAs or AlGaAs is expensive, it is still desirable to save the semiconductor element material. Therefore, it is still desirable to manufacture as many semiconductor thin-film layers as possible from the semiconductor element material of a certain area.

For this reason, there is a demand for technology capable of achieving reduction in manufacturing cost.

SUMMARY OF THE INVENTION

An aspect of the present invention is intended to achieve reduction in manufacturing cost.

According to an aspect of the present invention, there is provided a light emitting element array including a semiconductor thin-film layer in which a plurality of light emitting portions are arranged. The plurality of light emitting portions are driven to emit light in such a manner that an arrangement direction of the plurality of light emitting portions defines a main scanning direction. The plurality of light emitting portions are arranged in such a manner that adjacent light emitting portions are displaced from each other in a sub scanning direction perpendicular to the main scanning direction by a certain amount. An end portion of the semiconductor thin-film layer in the sub scanning direction has a shape along a pattern in which the plurality of light emitting portions are arranged.

With such a configuration, manufacturing can be efficiently performed, and manufacturing cost can be reduced.

According to another aspect of the present invention, there is provided a semiconductor device including at least one the light emitting element array and an integrated circuit for driving the light emitting element array. The light emitting element array is bonded to a surface of the integrated circuit.

According to still another aspect of the present invention, there is provided a manufacturing method of a semiconductor device including at least one the light emitting element array and an integrated circuit for driving the light emitting element array. The manufacturing method includes separating the light emitting element array from a semiconductor material substrate, and bonding the light emitting element array to a surface of the integrated circuit.

According to yet another aspect of the present invention, there is provided a printing head including the semiconductor device.

According to further aspect of the present invention, there is provided an image forming apparatus including a latent image bearing body, the printing head that exposes a surface of the latent image bearing body to form a latent image, a developing unit that develops the latent image to form a developer image, and a transfer unit that transfers the developer image to a medium.

DETAILED DESCRIPTION OF THE PREFERRED EMBODIMENT

First Embodiment

Hereinafter, a light emitting element array, a semiconductor device, a manufacturing method thereof, a printing head, and an image forming apparatus according to the first embodiment of the present invention will be described with reference to the drawings. In the description below, the semiconductor device and the printing head of the present invention are respectively embodied as a composite element chip and an optical printing head.

<Configuration of First Embodiment>

Figure 1:
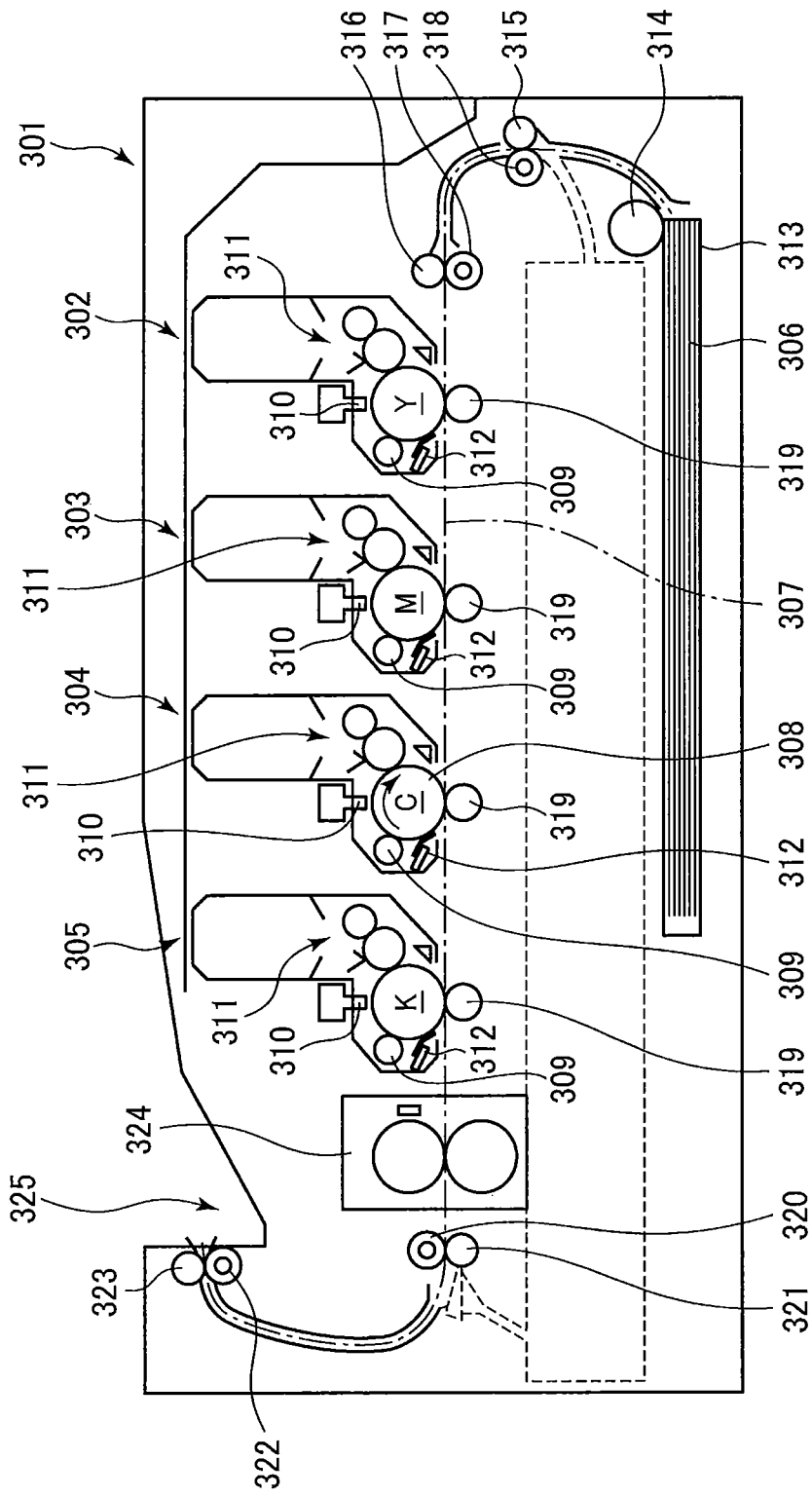
FIG. 1 is a schematic sectional view showing a printer according to the first embodiment.

FIG. 1 is a schematic sectional view showing an electrophotographic LED printer 301 (hereinafter referred to as a printer 301) including an optical printing head 110 having light emitting elements. The printer 301 includes four process units 302, 303, 304 and 305 that respectively form images of yellow (Y), magenta (M), cyan (C) and black (K) using electrophotography. The process units 302, 303, 304 and 305 are arranged in a line along a conveying path 307 of a recording medium 306.

Each of the process units 302, 303, 304 and 305 includes a photosensitive drum 308 as a latent image bearing body, and also includes a charging unit 309 and an exposure unit 310 provided around the photosensitive drum 308. The charging unit 309, uniformly charges a surface of the photosensitive drum 308. The exposure unit 310 emits light to selectively expose the surface of the photosensitive drum 308 to form a latent image.

Figure 2:
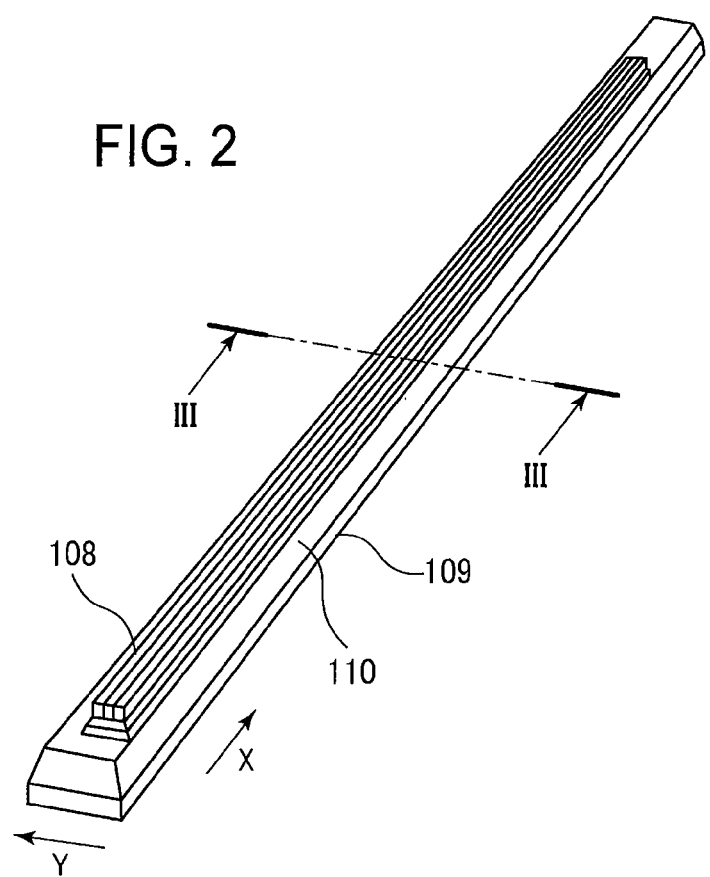
FIG. 2 is a perspective view showing a printing head according to the first embodiment.

The exposure unit 310 includes the optical printing head 110 (see FIG. 2). A detailed configuration of the optical printing head 110 will be described later.

Each of the process units 302, 303, 304 and 305 further includes a developing unit 311, and a cleaning unit 312. The developing unit 311 develops the latent image on the surface of the photosensitive drum 308 using a toner (i.e., a developer). The cleaning unit 312 removes a residual toner remaining on the surface of the photosensitive drum 308. The photosensitive drum 308 is driven by a driving mechanism (not shown) including a driving source and gears or the like, and rotates in a direction shown by an arrow. The printer 301 further includes a sheet cassette 313 (i.e., a medium storage body) storing the recording media 306 such as printing sheets, and a hopping roller 314 separating the recording medium 306 one by one and feeding each recording medium 306. A pair of a registration roller 318 and a pinch roller 315, and another pair of a registration roller 317 and a pinch roller 316 are provided downstream of the hopping roller 314 in a conveying direction of the recording medium 306. The registration roller 318 and the pinch roller 315 pinch the recording medium 306 therebetween, and convey the recording medium 306 while correcting a skew of the recording medium 306. The registration roller 317 and the pinch roller 316 pinch the recording medium 306 therebetween, and convey the recording medium 306 to the process units 302, 303, 304 and 305. The hopping roller 314 and the registration rollers 318 and 317 are driven by a driving source (not shown).

The printer 301 further includes transfer rollers 319 (i.e., transfer units) provided so as to face the photosensitive drums 308 of the process units 302, 303, 304 and 305. The transfer roller 319 includes a semiconductive rubber and the like. The photosensitive drum 308 and the transfer roller 319 are given electric potentials such that the toner image is transferred from the photosensitive drum 308 to the recording medium 306. The printer 301 further includes ejection rollers 320, 321, 322 and 323 for ejecting the recording medium 306.

The recording media 306 stored in the sheet cassette 313 are fed out by the hopping roller 314 one by one. Each recording medium 306 is conveyed by the registration rollers 318 and 317 and the pinch rollers 315 and 316, and reaches the process units 302, 303, 304 and 305. As the recording medium 306 passes through the process units 302, 303, 304 and 305, the recording medium 306 passes through nip portions between the photosensitive drums 308 and the transfer rollers 319, and toner images (i.e., developer images) of respective colors are transferred to the recording medium 306. Further, the recording medium 306 passes the fixing unit 324, and the toner image is fixed to the recording medium 306. Then, the recording medium 306 is ejected by the ejection rollers 320, 321, 322 and 323. The recording medium 306 is placed on a stacker 325.

Next, a configuration of the optical printing head 110 including a composite element chip 500 will be described.

Figure 3:
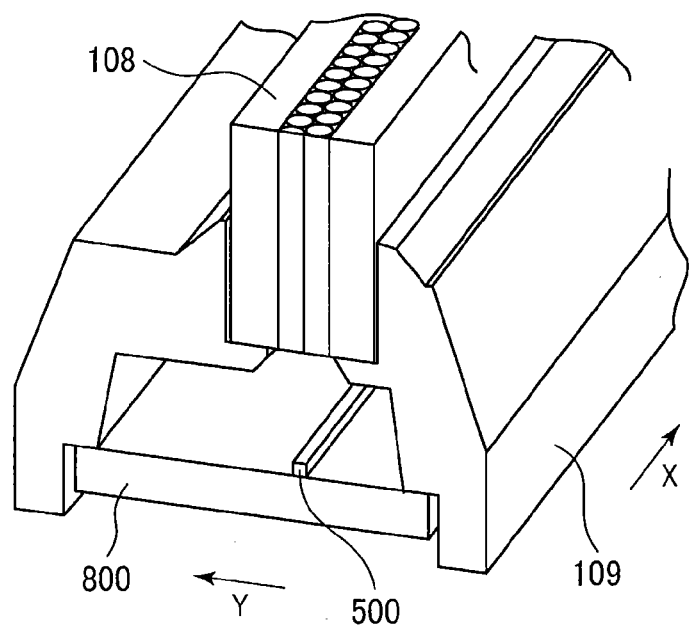
FIG. 3 is a cutaway perspective view showing the printing head according to the first embodiment.
Figure 4:
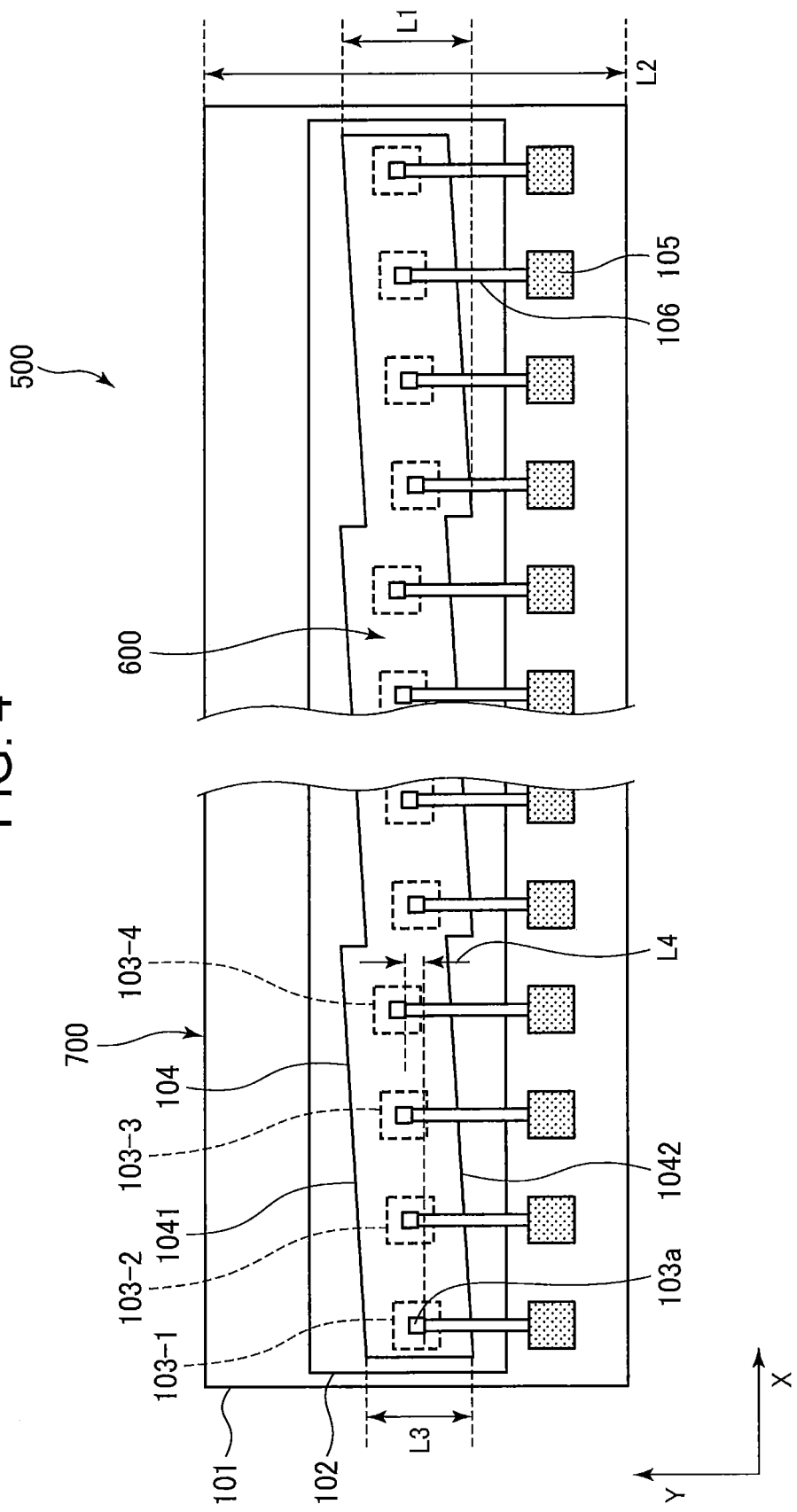
FIG. 4 is a plan view showing a composite element chip according to the first embodiment.

FIG. 2 is a perspective view showing an appearance of the optical printing head 110. FIG. 3 is a cutaway perspective view of the optical printing head 110 including a cross section taken along line in FIG. 2. FIG. 4 is a plan view showing the composite element chip 500 of the optical printing head 110.

As shown in FIG. 3, the optical printing head 110 includes a composite element chip 500 including a plurality of light emitting elements 103 which are arranged in a certain pattern, a print circuit board 800 on which the composite element chip 500 is mounted, a rod lens array 108 that focuses light emitted by the respective light emitting elements 103 of the composite element chip 500, and a frame 109.

Hereinafter, in FIG. 4, a longitudinal direction of the composite element chip 500 is referred to as a main scanning direction X or a left-right direction. The longitudinal direction of the composite element chip 500 is parallel to a longitudinal direction of the optical printing head 110, and also parallel to an axial direction of the photosensitive drum 308. A widthwise direction of the composite element chip 500 is referred to as a sub scanning direction Y or an up-down (vertical) direction. In other figures, the main scanning direction X and the sub scanning direction Y indicate the same directions as those in FIG. 4.

In the optical printing head 110, a plurality of the composite element chips 500 are arranged in the main scanning direction X on the print circuit board 800. The frame 109 is configured to hold the print circuit board 800 and the rod lens array 108. A positional relationship between the print circuit board 800 and the rod lens array 108 is determined by a focal distance. The frame 109 is formed of, for example, aluminum, structural steel or resin. In FIG. 3, the rod lens array 108 includes two rows of rod lenses. However, the number of rows of rod lenses is not limited.

As shown in FIG. 4, the composite element chip 500 includes a semiconductor thin-film layer 104 in which a plurality of the light emitting elements 103 are arranged. The semiconductor thin-film layer 104 including the light emitting elements 103 is bonded to a semiconductor integrated circuit substrate 101. Hereinafter, the light emitting elements 103 arranged in the semiconductor thin-film layer 104 are referred to as a light emitting element array 600. Each light emitting element 103 is formed as a part of the semiconductor thin-film layer 104. Each light emitting element 103 corresponds to a light emitting portion that emits light. A contact portion 103a is formed at a certain position (for example, a center) on a surface of each light emitting element 103 (i.e., a surface of the light emitting element 103 facing away from the semiconductor integrated circuit substrate 101).

A planarization film 102 is formed on a surface (on which the semiconductor thin-film layer 104 is provided) of the semiconductor integrated circuit substrate 101. The planarization film 102 has a planarized region. The planarization film 102 is formed of, for example, resin such as imide resin or acrylic resin, silicon nitride, silicon oxide, metal such as gold or gold alloy, alone or in combination. The planarization film 102 and the semiconductor thin-film layer 104 are stacked in this order on the surface of the semiconductor integrated circuit substrate 101.

The composite element chip 500 may be manufactured by forming the light emitting elements 103 on a semiconductor material substrate 107 (FIG. 6), separating the semiconductor thin-film layer 104 (including the light emitting elements 103) from the semiconductor material substrate 107, and bonding the semiconductor thin-film layer 104 (including the light emitting elements 103) to the surface of the semiconductor integrated circuit substrate 101. Alternatively, the composite element chip 500 may be manufactured by separating the semiconductor thin-film layer 104 from the semiconductor material substrate 107, bonding the semiconductor thin-film layer 104 to the surface of the semiconductor integrated circuit substrate 101, and forming the light emitting elements 103 in the semiconductor thin-film layer 104.

The contact portions 103*a* of the light emitting elements 103 are connected to electrode terminals 105 provided on the surface of the semiconductor integrated circuit substrate 101 using wires 106 by a wafer process including, for example, photolithography, wet etching, dry etching, formation of an insulation film, formation of a conductive film, and the like.

In the first embodiment, one semiconductor thin-film layer 104 includes all light emitting elements 103 (i.e., a light emitting element set 700) that constitute one composite element chip 500.

As shown in FIG. 4, in the light emitting element array 600 formed in the semiconductor thin-film layer 104, the light emitting elements 103 are arranged so that every four light emitting elements 103 form a group. In each group, the light emitting elements 103 are located on a line inclined with respect to the main scanning direction X. Each light emitting element 103 is displaced from the adjacent light emitting element 103 in the sub scanning direction Y by an equal amount.

Hereinafter, a group (set) of the four light emitting elements 103 is referred to as a light emitting element set 700. In this regard, the number of the light emitting elements 103 included in the light emitting element set 700 is not limited to four. In this example, a plurality of the light emitting element sets 700 are included in the composite element chip 500.

In FIG. 4, the light emitting elements 103-1, 103-2, 103-3 and 103-4 (constituting the light emitting element set 700) are arranged in this order from the left in FIG. 4. The leftmost light emitting element 103-1 is located at a lowermost position in FIG. 4. The rightmost light emitting element 103-4 is located at an uppermost position in FIG. 4. Further, in the light emitting element set 700, the leftmost light emitting element 103-1 and the rightmost light emitting element 103-4 is displaced from each other by a distance (i.e., a displaced amount) L4 in the sub scanning direction Y. The light emitting elements 103-2 and 103-3 are located on a straight line connecting the light emitting element 103-1 and the light emitting element 103-4. That is, the light emitting elements 103-1, 103-2, 103-3 and 103-4 are arranged at equal intervals in the main scanning direction X and in the sub scanning direction Y. In other words, the light emitting elements 103-1, 103-2, 103-3 and 103-4 are arranged on a straight line inclined with respect to the main scanning direction X.

As described above, the light emitting elements 103 of the semiconductor thin-film layer 104 are arranged so that every four light emitting elements 103 constitute one group (i.e., the light emitting element set 700) to form a pattern. This arrangement is employed for the following reason. If all of the light emitting elements 103 of the light emitting element array 600 are driven to emit light at the same time (to expose the surface of the photosensitive drum 108), an output load instantaneously increases. Therefore, in this embodiment, four light emitting elements 103 of each light emitting element set 700 are driven to emit light at time differences in order to reduce an instantaneous increase in output load.

An arrangement pattern of the light emitting elements 103 of the semiconductor thin-film layer 104 (i.e., the light emitting element array 600) is not limited. Hereinafter, a configuration example when the arrangement pattern shown in FIG. 4 is employed will be described.

Figure 5:
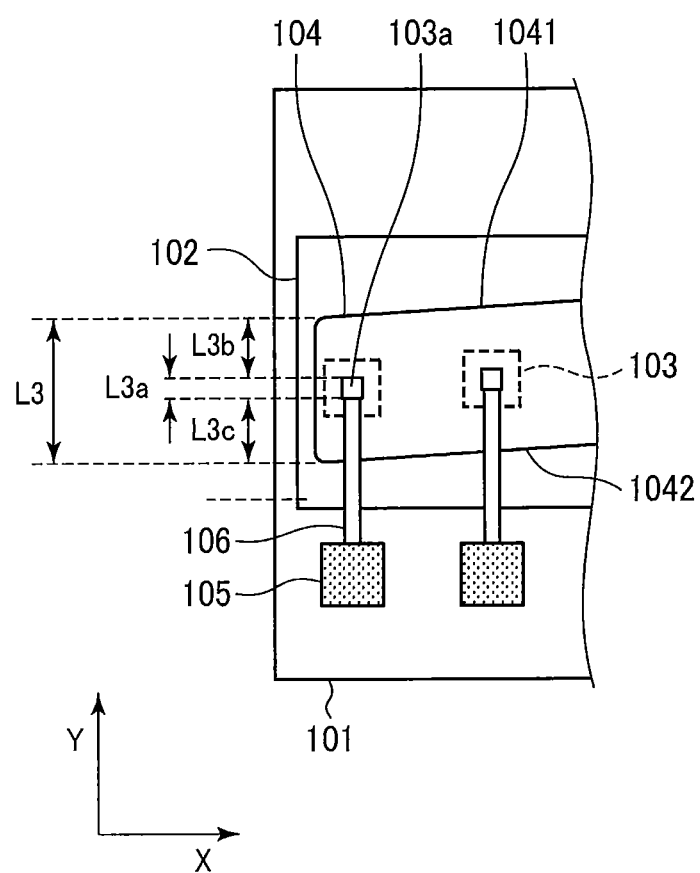
FIG. 5 is a schematic view showing a configuration of the semiconductor element array according to the first embodiment.

The semiconductor thin-film layer 104 has a shape along the arrangement pattern of the light emitting elements 103 (i.e., the light emitting element array 600). To be more specific, as shown in FIGS. 4 and 5, both ends 1041 and 1042 of the semiconductor thin-film layer 104 in the sub scanning direction Y (i.e., upper and lower ends in FIGS. 4 and 5) are formed so as to correspond to positions of the light emitting elements 103 in the sub scanning direction Y. In other words, both ends 1041 and 1042 of the semiconductor thin-film layer 104 in the sub scanning direction Y (i.e., the upper and lower ends in FIGS. 4 and 5) are inclined lines parallel to an inclined line along which the light emitting elements 103 are arranged.

In a particular example, as shown in FIG. 5, a dimension (i.e., a width) in the sub scanning direction Y of the semiconductor thin-film layer 104 at a position where the contact portion 103*a* of the light emitting element 103 is provided is a constant dimension L3. Here, the contact portion 103*a* of the light emitting element 103 is in the form of a plate having a rectangular shape.

Hereinafter, as shown in FIG. 5, a width of each contact portion 103*a* in the sub scanning direction Y is expressed as L3*a*. Further, a width (i.e., a shortest width) from an upper end of the contact portion 103*a* to the upper end 1041 of the semiconductor thin-film layer 104 is expressed as L3*b*. A width from a lower end of the contact portion 103*a* to the lower end 1042 of the semiconductor thin-film layer 104 is expressed as L3*c*. Values of the widths L3*a*, L3*b* and L3*c* are common for all of the light emitting elements 103 (i.e., the contact portions 103*a*). In practice, errors may occur in the widths L3*a*, L3*b* and L3*c* in a forming process of the semiconductor thin-film layer 104. Description is made under the presumption that the widths L3*a*, L3*b* and L3*c* are design dimensions.

As the widths L3*a*, L3*b* and L3*c* are common for all of the light emitting elements 103 (i.e., the contact portions 103*a*), shapes of both ends 1041 and 1042 (i.e., the upper and lower ends) of the semiconductor thin-film layer 104 in the sub scanning direction Y correspond to positions of the light emitting elements 103 in the sub scanning direction Y. As described above, every four light emitting elements 103 constitute one light emitting element set 700. In each light emitting element set 700, positions of the light emitting elements 103 (more specifically, positions of the contact portions 103*a*) are respectively displaced in the sub scanning direction Y. As a result, as shown in FIG. 4, in a region where the light emitting elements 103 of each light emitting element set 700 are formed, a line connecting the light emitting elements 103-1 and 103-4 on both ends in the main scanning direction X is parallel to lines of the ends 1041 and 1042 of the semiconductor thin-film layer 104. In this way, the ends 1041 and 1042 (i.e., the upper and lower ends in FIG. 4) of the semiconductor thin-film layer 104 in the sub scanning direction Y have shapes along the arrangement pattern of the light emitting elements 103 constituting the light emitting element array 600. In other words, the outer shape of the semiconductor thin-film layer 104 (i.e., the shapes of the ends 1041 and 1042 in the sub scanning direction Y) are inclined, bent or curved with respect to the main scanning direction X in accordance with the arrangement of the light emitting elements 103. That is, the outer shape of the semiconductor thin-film layer 104 are staggered or saw-tooth shapes with respect to the main scanning direction X in accordance with the arrangement of the light emitting elements 103.

<Manufacturing Method of First Embodiment>

Next, a manufacturing method of the composite element chip 500 (i.e., the semiconductor device) of the first embodiment will be described.

Figure 6:
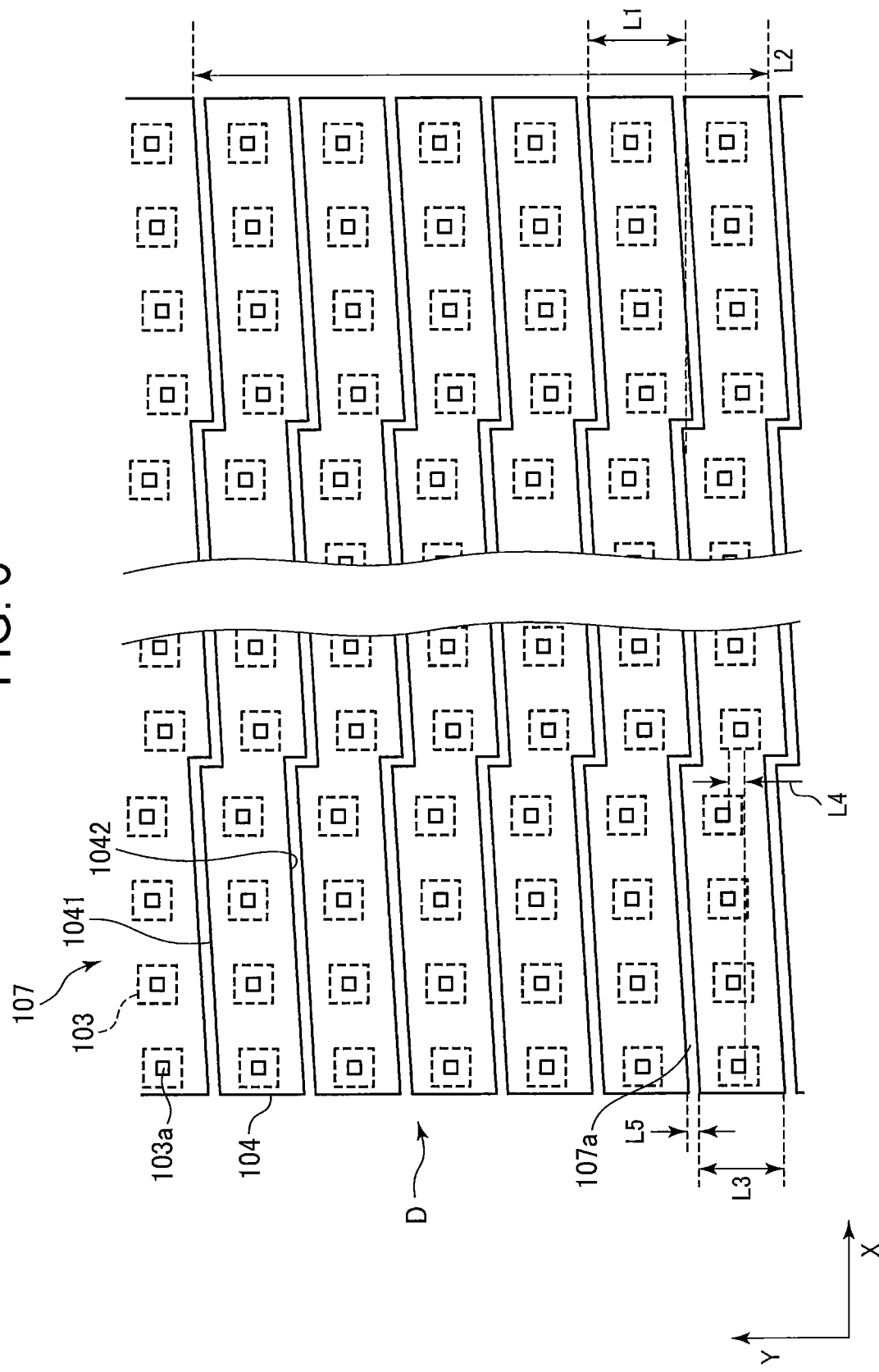
FIG. 6 is a plan view showing semiconductor thin-film layers (i.e., the semiconductor element arrays) formed on a semiconductor material substrate according to the first embodiment.

FIG. 6 is a plan view showing a semiconductor material substrate 107 on which a plurality of the semiconductor thin-film layers 104 are formed.

In FIG. 6, the plurality of semiconductor thin-film layers 104 are formed in a region D on a surface of the semiconductor material substrate 107. The region D has a dimension L2 in the sub scanning direction Y. The region D has a dimension in the main scanning direction X which is the same as the width of one semiconductor thin-film layer 104 (i.e., the composite element chip 500). In other words, in FIG. 6, the semiconductor thin-film layers 104 are arranged in the sub scanning direction Y in the region D.

In practice, the shape of the semiconductor material substrate 107 is not limited. Here, description will be made of an example where the semiconductor thin-film layers 104 are formed in the region D having a rectangular shape so as to efficiently form the composite element chips 500. Structures of the semiconductor thin-film layers 104 (except for the shapes of the semiconductor thin-film layer 104 and the positions of the light emitting elements 103) may be similar to those of various kinds of optical light emitting elements such as LEDs (Light Emitting Diodes), light emitting thyristors or the like, and therefore detailed descriptions will be omitted.

The composite element chip 500 of this embodiment is manufactured by forming the semiconductor thin-film layers 104 on the surface of the semiconductor material substrate 107 as shown in FIG. 6, selectively separating the semiconductor thin-film layers 104 from the semiconductor material substrate 107 and bonding the semiconductor thin-film layers 104 to the planarization film 102 on the semiconductor material substrate 107.

A process of selectively separating the semiconductor thin-film layers 104 from the semiconductor material substrate 107 and a process of bonding the semiconductor thin-film layers 104 to the semiconductor integrated circuit substrate 101 (the planarization film 102) are performed by various kinds of semiconductor assembly equipment, and therefore detailed descriptions will be omitted.

In FIG. 6, six semiconductor thin-film layers 104 are arranged in the sub scanning direction Y (i.e., in the up-down direction in FIG. 4) in the region D. Each semiconductor thin-film layer 104 has both ends 1041 and 1042 having staggered (saw-tooth) shapes along the arrangement pattern of the light emitting elements 103. The light emitting elements 103 (i.e., light emitting element array 600) is formed in the semiconductor thin-film layers 104.

As shown in FIG. 6, each of the semiconductor thin-film layers 104 formed in the region D has a dimension L1 in the sub scanning direction Y (i.e., a dimension between an uppermost portion and a lowermost portion). Further, the semiconductor thin-film layers 104 adjacent to each other in the sub scanning direction Y have shapes such that the ends 1041 and 1042 having staggered shapes (or saw-tooth shapes) mesh with each other. Further, in the region D, the adjacent semiconductor thin-film layers 104 face each other with a groove portion 107a formed therebetween. The groove portion 107a has a width L5.

In this way, the semiconductor thin-film layers 104 are arranged so that the ends of the adjacent semiconductor thin-film layers 104 have staggered shapes (or saw-tooth shapes) meshing with each other via the width L5 formed therebetween.

Suitable examples of dimensions L1, L2, L3, L4 and L5 will be described. Hereinafter, description will be made of an example in which the optical printing head 110 has a resolution in a range from 600 dpi through 1200 dpi in the main scanning direction X.

When the optical printing head 110 has the resolution in the range from 600 dpi through 1200 dpi in the main scanning direction X, a width of the light emitting element 103 (centering on the contact portion 103a) needs to be approximately in a range from 30 μm to 50 μm in the sub scanning direction Y.

As described above, mechanical equipment is used to selectively separate the semiconductor thin-film layers 104 from the semiconductor material substrate 107 and bonding the semiconductor thin-film layers 104 to the surface of the semiconductor integrated circuit substrate 101. A feeding precision of general equipment is approximately several μm. For this reason, in order to perform selective separation of the semiconductor thin-film layers 104 from the semiconductor material substrate 107 while ensuring a sufficient yield rate, the adjacent semiconductor thin-film layers 104 need to be apart from each other by a distance (i.e., the width L5) which is greater than or equal to a maximum permissible error (i.e., a maximum possible displacement) of the separation.

Further, when the optical printing head 110 has the resolution in the range from 600 dpi through 1200 dpi in the main scanning direction X, a displacement amount L4 between the leftmost light emitting element 103 and the rightmost light emitting element 103 of each light emitting element set 700 (i.e., four light emitting elements 103) in the main scanning direction X is preferably in a range from several μm to 10 μm in terms of a conveying speed of the medium and a scanning speed of the optical printing head 110.

In consideration of the above described conditions, in a particular example, the dimension are set as described below. The dimension L2 of the region D in the sub scanning direction Y is 300 μm. The width L3 of the semiconductor thin-film layer 104 in the sub scanning direction Y required for one light emitting element 103 is 45 μm. The displacement amount L4 between the leftmost light emitting element 103 and the rightmost light emitting element 103 of each light emitting element set 700 (i.e., four light emitting elements 103) is 10 μm. A width of the groove portion 107a between each adjacent semiconductor thin-film layers 104 is set to 5 μm. In this case, the dimension L1 of each light emitting element 103 in the sub scanning direction Y is L3+L4=45+10=55 μm. Further, in this example, the width L3a of the contact portion 103a is 10 µm. The widths L3b and L3c of the contact portion 103a are both 17.5 µm.

As shown in FIG. 6D, the dimension. L1 of each semiconductor thin-film layer 104 (formed in the region D of the semiconductor material substrate 107) in the sub scanning direction Y is 55 µm. Therefore, if a plurality of semiconductor thin-film layers 104 are simply arranged in the region D at intervals equal to the width L5 (5 µm), the maximum number of the semiconductor thin-film layers 104 is 5 (i.e., L2/(L1+L5)=300/60=5). However, as shown in FIG. 6, by arranging the semiconductor thin-film layers 104 in the region D so that the ends 1041 and 1042 of the adjacent semiconductor thin-film layers 104 have the staggered shapes (or tooth-like shapes) meshing with each other via the groove portion 107a having the width L5, an unnecessary region (in terms of a function of the light emitting elements 103) in the region D can be reduced. As a result, the number of the semiconductor thin-film layers 104 formed in the region D can be increased to 6 (i.e., L2/(L3+L5)=300/(45+5)=6) as shown in FIG. 6.

<Effects of First Embodiment>

As described above, according to the embodiment of the present invention, the semiconductor thin-film layer 104 has the shape along the arrangement pattern of the light emitting elements 103 (i.e., the light emitting element array 600). Further, the semiconductor thin-film layers 104 are arranged so that the ends 1041 and 1042 of the adjacent semiconductor thin-film layers 104 have staggered shapes (or tooth-like shapes) meshing with each other. Therefore, the number of the semiconductor thin-film layers 104 made from the semiconductor material substrate 107 can be increased, with the result that manufacturing cost of the composite element chip 500 can be reduced.

Figure 7:
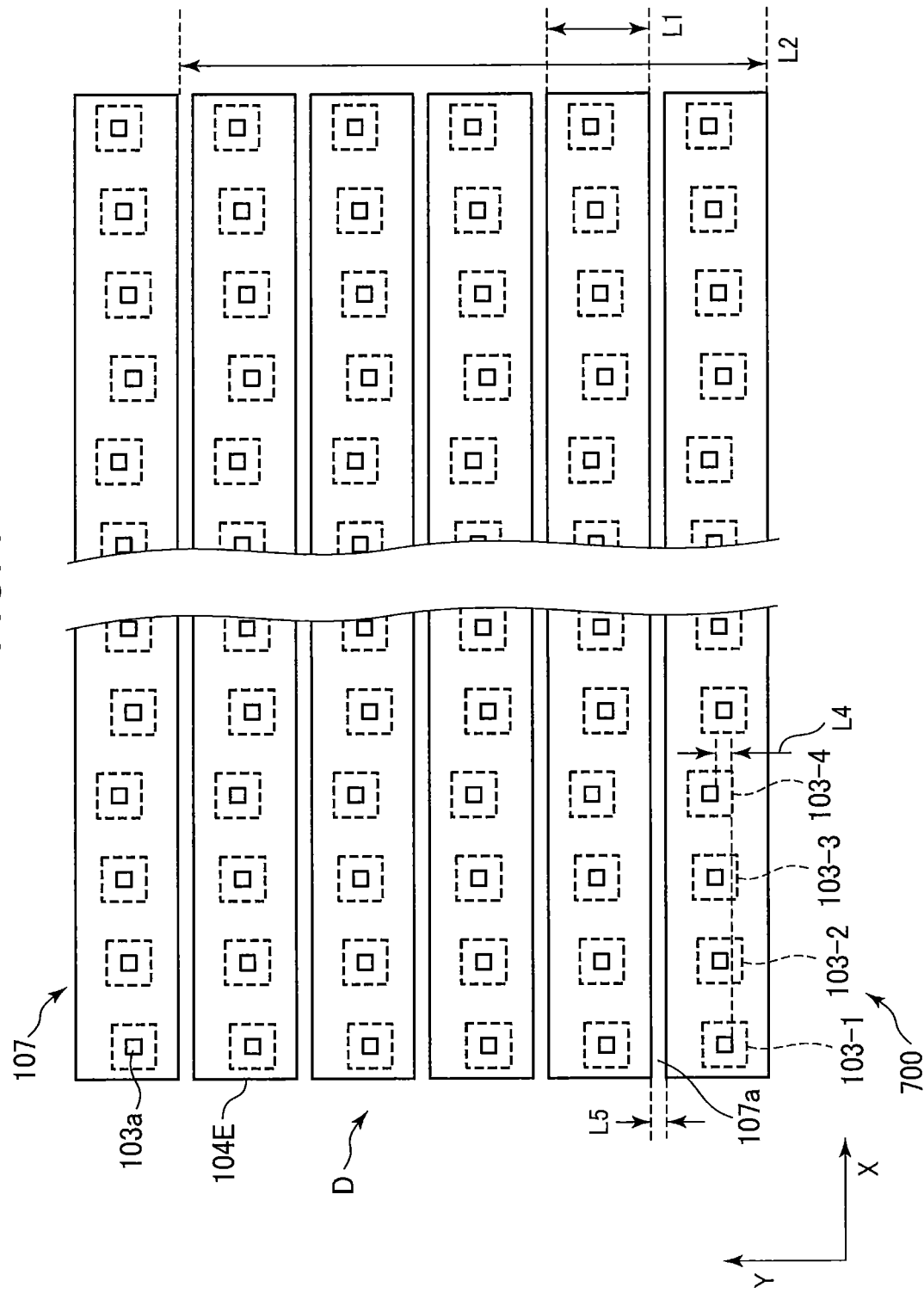
FIG. 7 is a schematic view showing an example in which the semiconductor element arrays are formed as rectangular semiconductor thin-film layers.

For comparison, an example where the semiconductor thin-film layers 104 have rectangular shapes will be described with reference to FIG. 7. FIG. 7 is a plan view showing the example in which semiconductor thin-film layers 104E having rectangular shapes are formed in the region D on the surface of the semiconductor material substrate 107.

In the example shown in FIG. 7, if each semiconductor thin-film layer 104E has the rectangular shape, the semiconductor thin-film layer 104E needs to have the dimension L1 (described with reference to FIGS. 4 and 6) in the sub scanning direction Y. The groove portion 107a having the width L5 is formed between each adjacent semiconductor thin-film layers 104E. Further, in the example shown in FIG. 7, the upper and lower ends of the semiconductor thin-film layer 104E have straight shapes. That is, the ends of the adjacent semiconductor thin-film layer 104E do not have shapes meshing with each other. Therefore, an unnecessary region in terms of the function of the light emitting element 103 (for example, in an upper portion of the leftmost light emitting element 103-1 of the light emitting element set 700, or the like) may be formed in the semiconductor thin-film layers 104E.

In contrast, according to the first embodiment, the unnecessary region on the semiconductor material substrate 107 can be reduced as described with reference to FIGS. 4 and 6. That is, the number of the semiconductor thin-film layers 104 made from the semiconductor material substrate 107 can be increased.

Further, according to the first embodiment, redundant structures of the semiconductor thin-film layers 104 can be made the same for the respective light emitting elements 103. Therefore, according to the first embodiment, causes of difference in electric and optical properties among the light emitting elements 103 can be reduced.

Second Embodiment.

Hereinafter, a light emitting element array, a semiconductor device, a manufacturing method thereof, a printing head, and an image forming apparatus according to the second embodiment of the present invention will be described with reference to the drawings. In the description below, the semiconductor device and the printing head of the present invention are respectively embodied as a composite element chip and an optical printing head.

<Configuration of Second Embodiment>

Differences of a printer 301 and a composite element chip 500A of the second embodiment from those of the first embodiment will be described.

In the printer 301 of the second embodiment, shapes and manufacturing method of semiconductor thin-film layers 104A are different from the semiconductor thin-film layers 104 of the first embodiment.

Figure 8:
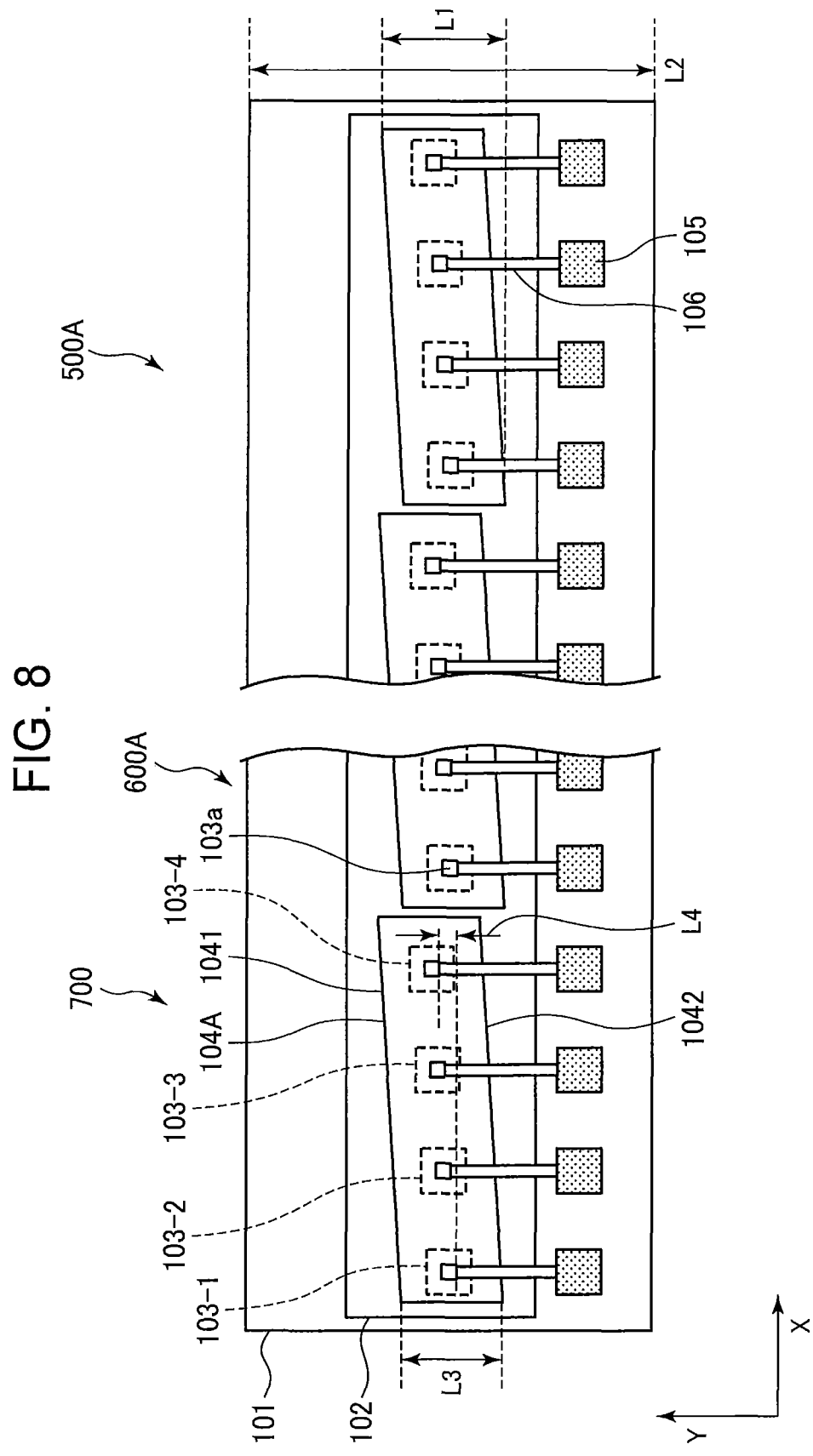
FIG. 8 is a plan view showing a composite element chip according to the second embodiment.

FIG. 8 is a plan view showing the composite element chip 500A of the second embodiment. In the above described first embodiment, all of the light emitting elements 103 (i.e., the light emitting element set 700) of one composite element chip 500A is included in one semiconductor thin-film layer 104A. In contrast, in the second embodiment, the light emitting elements 103 (i.e., the light emitting element set 700) constituting one composite element chip 500A is provided in a plurality of semiconductor thin-film layers 104A. In other words, in the second embodiment, each semiconductor thin-film layers 104A are divided in the main scanning direction X in the region D. In this regard, the number of the light emitting elements 103 (included in the respective semiconductor thin-film layers 104A) in respective composite element chips 500A are not necessarily the same as each other.

In the second embodiment, as shown in FIG. 8, each semiconductor thin-film layer 104A includes one light emitting element set 700 (i.e., four light emitting elements 103-1, 103-2, 103-3 and 103-4). In other words, the semiconductor thin-film layers 104A are divided (separated) for the respective light emitting element sets 700. The light emitting elements 103 arranged in the semiconductor thin-film layer 104A are referred to as a light emitting element array 600A.

<Manufacturing Method of Second Embodiment>

Next, a manufacturing method of the composite element chip 500A (i.e., the semiconductor device) of the second embodiment will be described.

Figure 9:
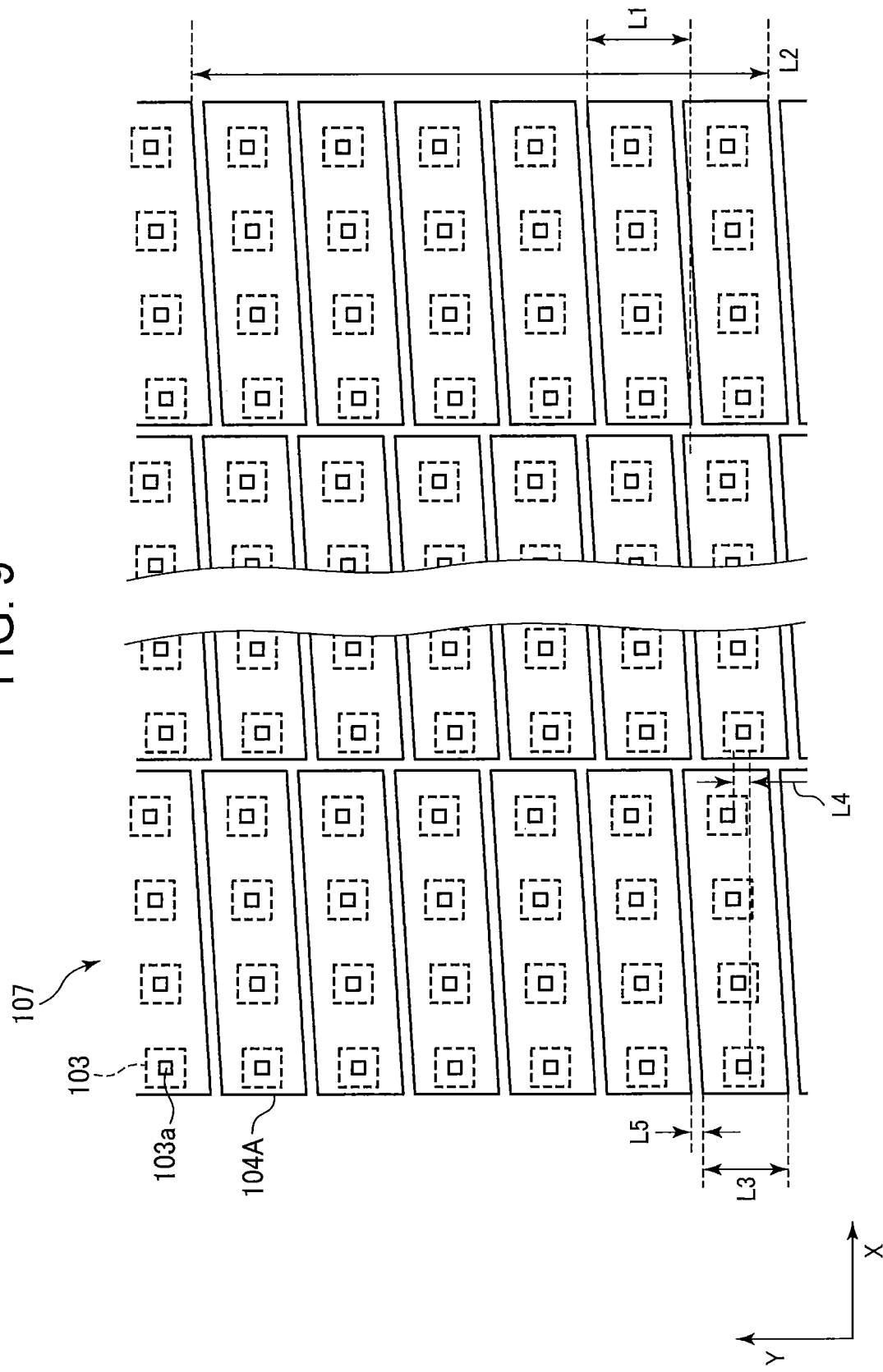
FIG. 9 is a plan view showing semiconductor thin-film layers (i.e., semiconductor element arrays) formed on a semiconductor material substrate according to the second embodiment.

FIG. 9 is a plan view showing the semiconductor material substrate 107 on which a plurality of the semiconductor thin-film layers 104A are formed.

In FIG. 9, the plurality of semiconductor thin-film layer 104A are formed in the region D having a rectangular shape on the surface of the semiconductor material substrate 107. The region D has a dimension L2 in the sub scanning direction Y.

The semiconductor thin-film layers 104A shown in FIG. 9 have structures obtained by dividing the semiconductor thin-film layers 104 shown in FIG. 6 for the respective light emitting element sets 700.

As shown in FIG. 9, in the second embodiment, the semiconductor thin-film layers 104A constituting at least one composite element chip 500A are formed on the surface of the semiconductor material substrate 107, and are arranged in the main scanning direction X.

Therefore, the composite element chip 500A can be manufactured by separating the semiconductor thin-film layers 104A from the semiconductor material substrate 107, and bonding the semiconductor thin-film layers 104A to the surface of the semiconductor integrated circuit substrate 101, while maintaining a positional relationship of the semiconductor thin-film layers 104A formed on the semiconductor material substrate 107. In other words, in the second embodiment, the semiconductor thin-film layers 104A are formed on the semiconductor material substrate 107 in the same positional relationship as those provided on the semiconductor integrated circuit substrate 101.

Further, in the second embodiment, as shown in FIG. 8 and FIG. 9, each semiconductor thin-film layer 104A has a parallelogram shape. Top and bottom sides (i.e., both ends 1041 and 1042 in the sub scanning direction Y) of the parallelogram shape of the semiconductor thin-film layer 104A are parallel to inclined lines along which the light emitting elements 103 of the light emitting element set 700 are provided.

In the second embodiment, suitable ranges of the dimensions L1, L3, L4 and L5 are the same as those described in the first embodiment, and therefore detailed descriptions will be omitted. In a particular example, the width L3 of each semiconductor thin-film layer 104A in the sub scanning direction Y required for one light emitting element 103 is set to 45 µm. A displacement amount L4 (in the sub scanning direction Y) of the light emitting elements 103 on both ends of each light emitting element set 700 is set to 10 µm. The width between each adjacent semiconductor thin-film layers 104A is 5 µm.

<Effects of Second Embodiment>

The second embodiment of the present invention provides the following effects in addition to the effects of the first embodiment.

Generally, the semiconductor thin-film layer 104 is applied with a membrane stress along the main scanning direction X depending on a length of the semiconductor thin-film layer 104 in the main scanning direction X. If a conductive film (such as a metal film) or an organic or inorganic insulation film exists on the surface of the semiconductor thin-film layer 104, the membrane stress further increases. This may cause separation of the semiconductor thin-film layer 104 or may cause a change in properties of the light emitting elements 103. In the second embodiment, the light emitting elements 103 of one composite element chip 500A is included in the plurality of semiconductor thin-film layers 104A. As a result, a dimension of each semiconductor thin-film layer 104A in the main scanning direction X is reduced, and therefore membrane stress can be reduced. Thus, separation of the semiconductor thin-film layer 104A can be prevented, and causes of the change in properties of the light emitting elements 103 can be reduced.

In the second embodiment, since the length of the semiconductor thin-film layer 104A in the main scanning direction X is reduced, a change in pitch length (i.e., a distance between adjacent light emitting elements 103) of the semiconductor thin-film layer 104A separated from the semiconductor material substrate 107 (in the main scanning direction X) can be reduced, and decrease in precision caused thereby can be reduced. As a result, variation of the pitch length of the light emitting elements 103 of the composite element chip 500A can be reduced, and therefore degradation in quality (decrease in precision of the optical printing head 110).

Figure 10:
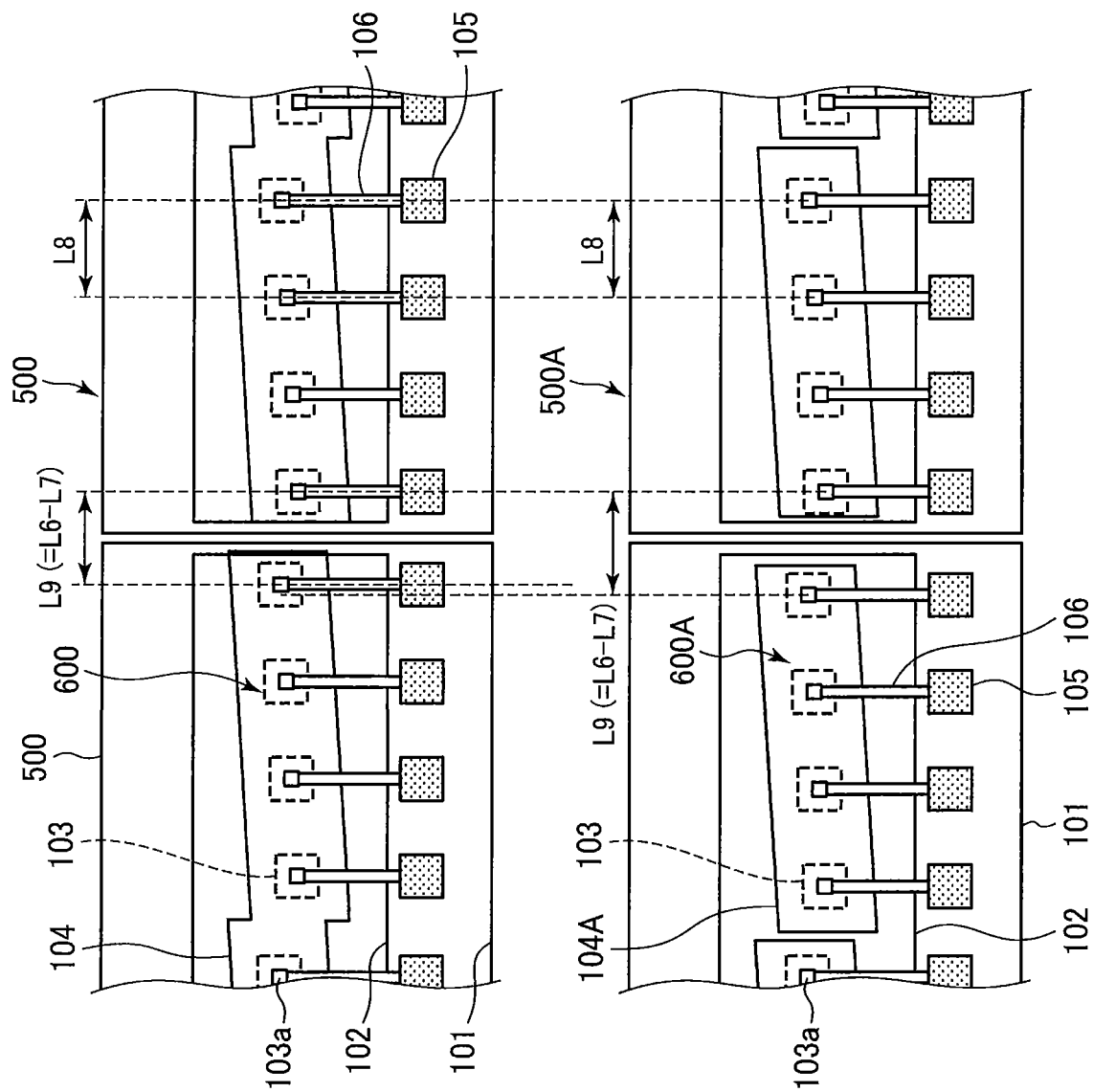
FIGS. 10A and 10B are schematic views for illustrating an effect of the second embodiment.

FIGS. 10A and 10B are schematic diagrams for illustrating the effect in suppressing decrease in the precision caused by the change in pitch length of the semiconductor thin-film layer 104A. FIG. 10A is an enlarged view showing a part of the composite element chip 500 of the first embodiment.

FIG. 10B is an enlarged view showing a part of the composite element chip 500A of the second embodiment.

FIG. 10A shows a border portion between the adjacent semiconductor thin-film layers 104 (i.e., portions between ends in the main scanning direction X) in the first embodiment in enlarged scale. FIG. 10B shows a border portion between the adjacent semiconductor thin-film layers 104A (i.e., portions between ends in the main scanning direction X) in the second embodiment in enlarged scale.

Generally, if the semiconductor material substrate 107 and the semiconductor thin-film layer 104 have different lattice constants, the length of the semiconductor thin-film layer 104 changes between before and after the separation from the semiconductor material substrate 107. Therefore, when semiconductor thin-film layer 104 (in which the light emitting elements 103 are preliminarily formed) is separated from the semiconductor material substrate 107, and is bonded to the surface of the semiconductor integrated circuit substrate 101, the pitch of the light emitting elements 103 on the semiconductor integrated circuit substrate 101 is different from the pitch length of the light emitting elements 103 on the semiconductor material substrate 107. For example, when the semiconductor thin-film layer 104 is formed by epitaxially growing a GaAs layer and an $Al_xGa_{(1-x)}As$ layer (0<x<1) on the semiconductor material substrate 107 composed of a GaAs substrate, and is separated from the material substrate 107, the length of the semiconductor thin-film layer 104 in the main scanning direction X increases by 0.2 percent as compared to before separation.

A general optical printing head used in a general electrophotographic printer has a length of 297 mm (A4 size) in the main scanning direction X, and has a resolution of 600 dpi (42.3 µm) in the main scanning direction X. When the optical printing head 110 including the composite element chip 500 is applied to the general electrophotographic printer, the dimension of the composite element chip 500 in the main scanning direction X is greater than or equal to several mm.

For example, as shown in FIG. 10A, when the dimension of the composite element chip 500 (i.e., the semiconductor thin-film layer 104) in the main scanning direction X is approximately 8 mm, and when all of the light emitting elements 103 of one composite element chip 500 is included in one semiconductor thin-film layer 104, an increasing amount L7 of the length of the semiconductor thin-film layer 104 (after separation from the semiconductor material substrate 107) in the main scanning direction X is several tens µm. When such composite element chip 500 is mounted to the semiconductor integrated circuit substrate 101, a pitch L8 of the light emitting elements 103 of the same composite element chip 500 in the main scanning direction X is almost the same as a designed pitch L6 (i.e., 42.3 µm). However, a pitch L9 of the light emitting elements 103 provided on facing ends of adjacent composite element chips 500 is shorter than the designed pitch L6 by an amount equal to the increasing amount L7 of the length of the semiconductor thin-film layer 104. This is preferably solved in order to enhance printing quality of the printer 301.

In contrast, according to the second embodiment, for example, one semiconductor thin-film layer 104A includes one light emitting element set 700 (i.e., four light emitting elements 103). With such a configuration, the length of the semiconductor thin-film layer 104A in the main scanning direction X is less than or equal to 200 µm. Therefore, when the semiconductor thin-film layer 104A of the second embodiment is separated from the semiconductor material substrate 107, the increasing amount L7 of the length of the semiconductor thin-film layer 104 is reduced to approximately 0.4 µm or less. This is sufficiently small as compared to the designed pitch L6 (42.3 µm) in the main scanning direction X for the resolution of 600 dpi. As a result, the effect on the degradation of printing quality can be reduced to an ignorable level.

Figure 11:
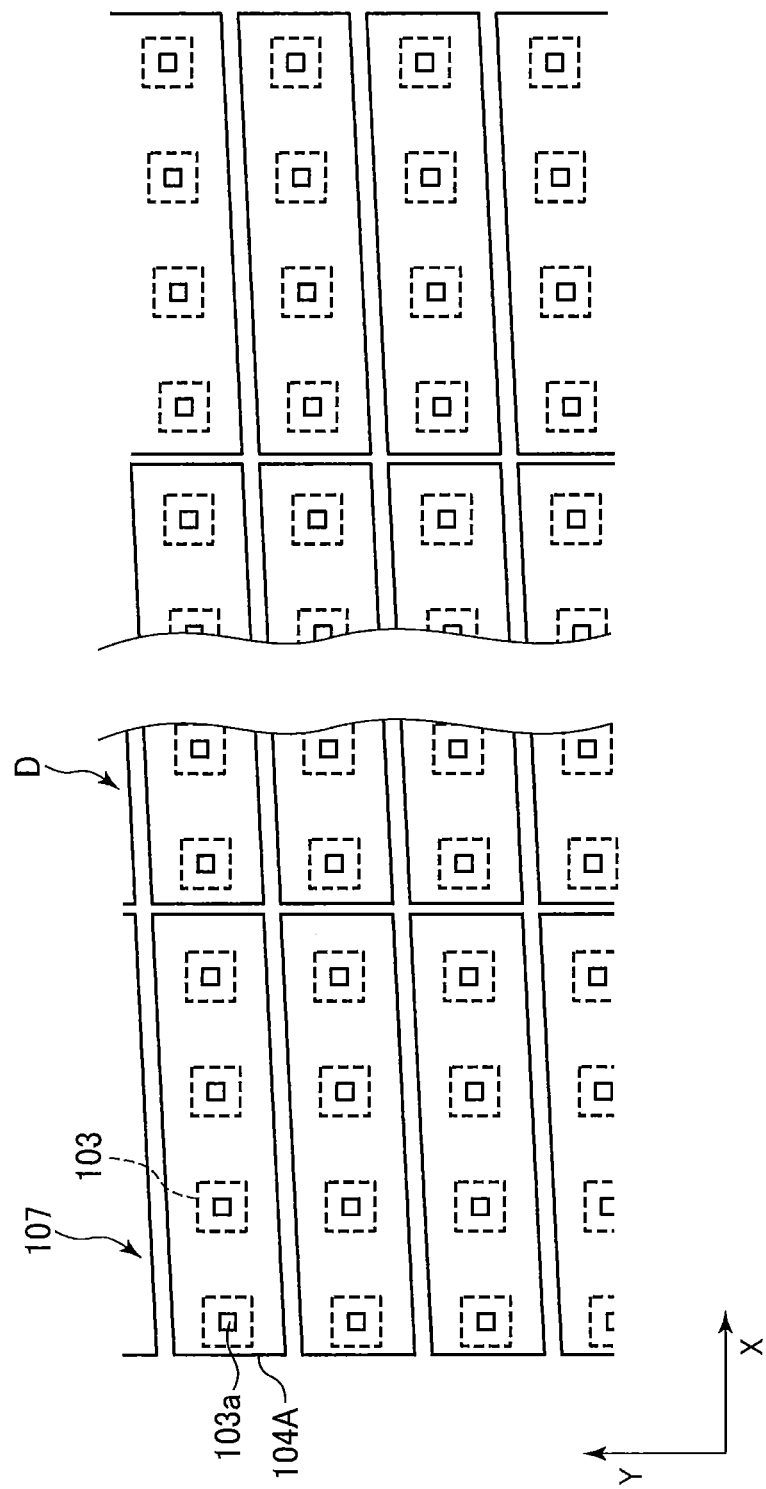
FIG. 11 is a schematic view showing an example in which the semiconductor element arrays are arranged linearly according to the second embodiment.

In this regard, for example, as shown in FIG. 11, the semiconductor thin-film layers 104A having parallelogram shapes may be arranged along a straight line on the semiconductor material substrate 107 in such a manner that ends in the sub scanning direction Y of the adjacent semiconductor thin-film layers 104A are aligned in line with each other.

However, as shown in FIG. 9, efficient assembly can be achieved by forming the light emitting elements 103 on the semiconductor material substrate 107 in the same positional relationship as the light emitting elements 103 arranged on the semiconductor integrated circuit substrate 101. This is because the positional relationship of the light emitting elements 103 needs not be corrected when the composite element chip 500A is assembled (i.e., when the semiconductor thin-film layers 104A are positioned and bonded to the semiconductor integrated circuit substrate 101).

Modifications.

The present invention is not limited to the above described embodiments, but the following modifications may be made to the embodiments.

In the above described embodiments, the printing head of the present invention is applied to the electrophotographic printer having the LED exposure head. However, the printing head of the present invention is applicable to an image forming apparatus such as a facsimile machine, a copier, a Multi-Function Peripheral (MFP) or the like.

Figure 12:
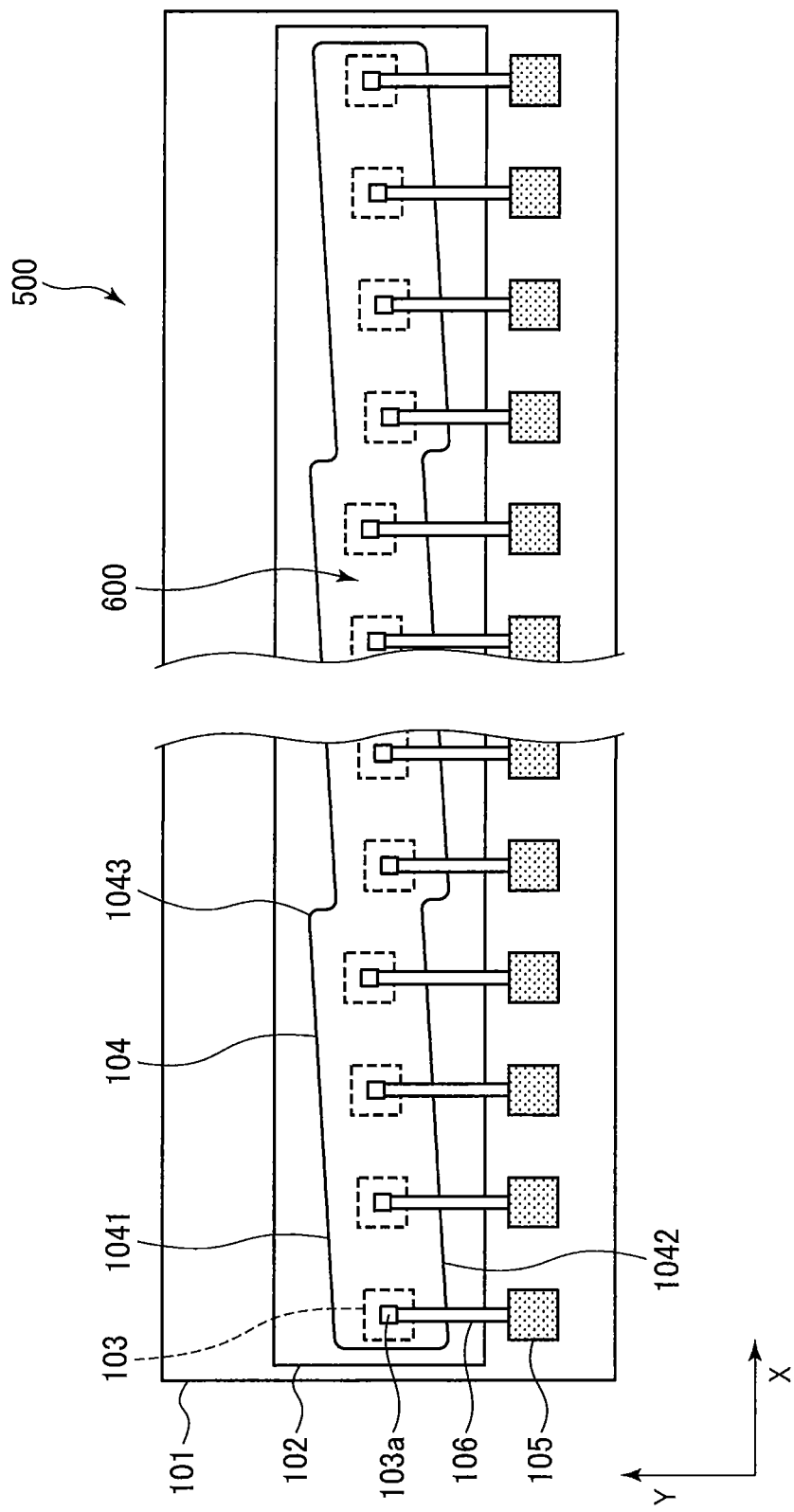
FIG. 12 is a plan view showing a composite element chip according to a modification of the first embodiment.

FIG. 12 is a plan view showing a composite element chip 500 of a modification of the first embodiment. In the modification shown in FIG. 12, semiconductor thin-film layer 104 have corner portions 1043 having curved shapes (more specifically, rounded shapes).

Figure 13:
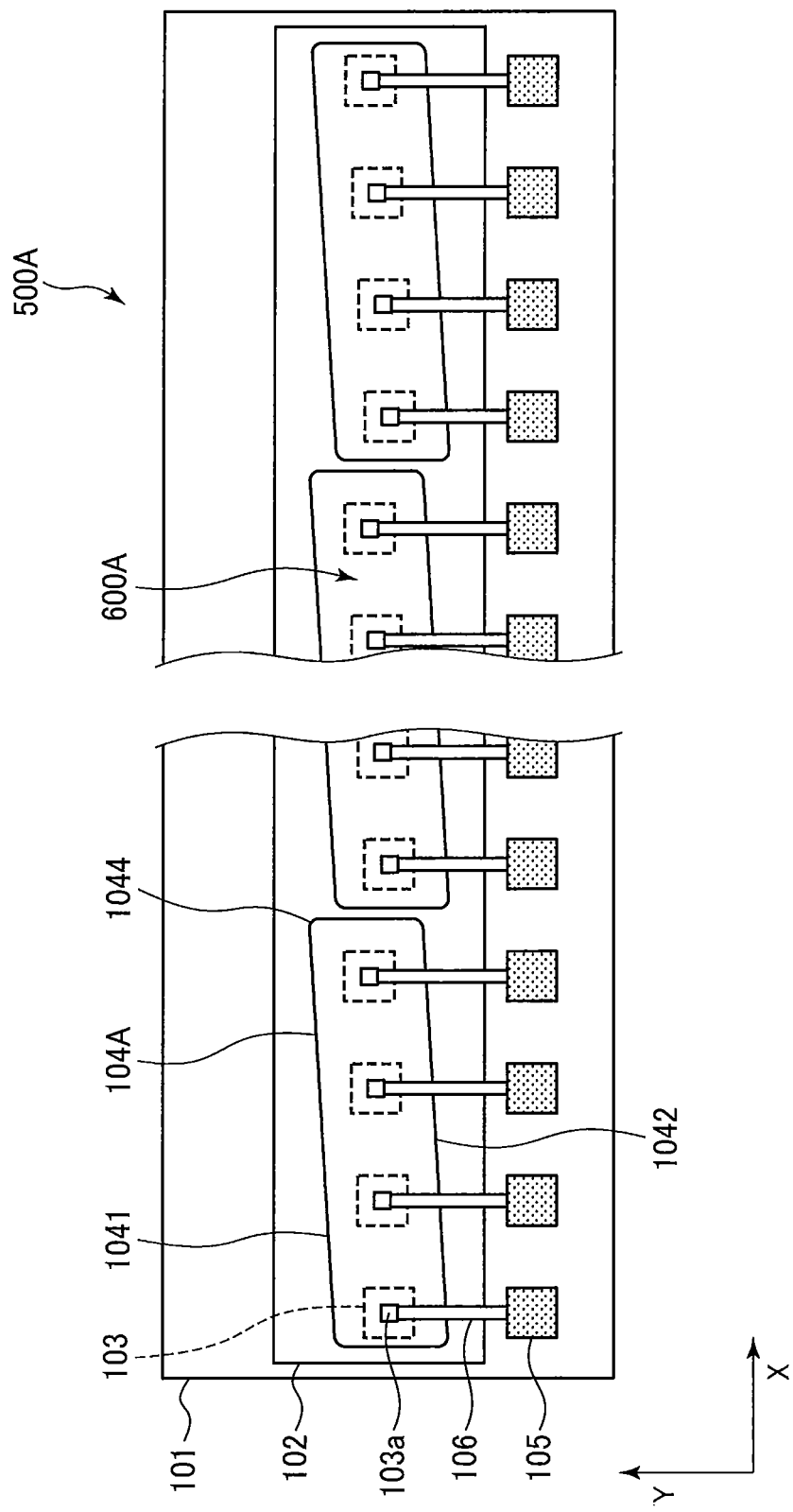
FIG. 13 is a plan view showing a composite element chip according to a modification of the second embodiment.

FIG. 13 is a plan view showing a composite element chip 500A of a modification of the second embodiment. In the modification shown in FIG. 13, semiconductor thin-film layer 104A have corner portions 1044 having curved shapes (more specifically, rounded shapes).

In the modifications shown in FIGS. 12 and 13, curvatures are given to the corner portions 1043 (1044) of outer shapes of the semiconductor thin-film layer 104 (104A), and therefore membrane stresses applied to the corner portions 1043 (1044) can be relieved. As a result, the separation of the semiconductor thin-film layer 104 (104A) bonded to the planarized region on the surface of the semiconductor integrated circuit substrate 101 (which is likely to occur at the corner portions) can be prevented.

In the light emitting element arrays 600 (600A) of the above described embodiments, the light emitting elements 103 are arranged at equal intervals. However, the light emitting elements 103 are not necessarily arranged at equal intervals. Further, in the light emitting element arrays 600 (600A) of the above described embodiments, the light emitting elements 103 are arranged in an inclined, bent or curved pattern. However, the light emitting elements 103 may be arranged in a regular or irregular pattern. Further, the number of the light emitting elements 103, and the number of the steps of the staggered shape of the semiconductor thin-film layers 104 (104A) are not limited to those shown in figures.

Figure 14:
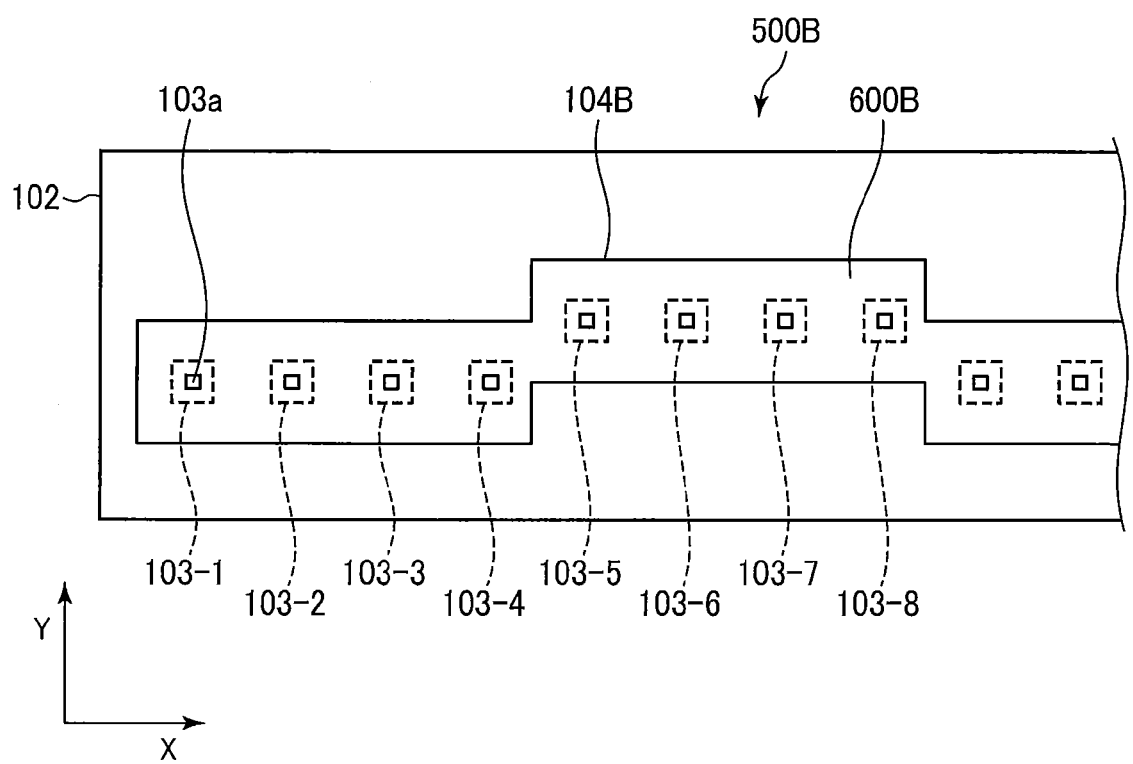
FIG. 14 is a plan view showing a composite element chip according to another modification of the first embodiment.

In the light emitting element array 600 (600A) of the above described embodiments, every four light emitting elements 103 form a group, and that adjacent light emitting elements 103 in each group are displaced from each other in the sub scanning direction Y. However, the present invention is not limited to such a configuration. FIG. 14 shows a composite element chip 500B of a modification in which the light emitting elements 103 of the predetermined number are in the same position (i.e., the same step) in the sub scanning direction Y. For example, in FIG. 14, the light emitting elements 103 are arranged in such a pattern that the leftmost four light emitting elements 103-1, 103-2, 103-3 and 103-4 and the next four light emitting elements 103-5, 103-6, 103-7 and 103-8 are displaced from each other in the Y direction (i.e., are in different steps). In other words, the light emitting elements 103 are arranged in a rectangular waveform pattern. Further, a semiconductor thin-film layer 104B has an outer shape along the arrangement pattern of the light emitting elements 103 (i.e., the arrangement pattern of a light emitting element array 600B). The optical printing head 110 using the light emitting element array 600B may be operated by, for example, driving the light emitting elements 103 at different timings depending on the steps (i.e., positions in the sub scanning direction Y).

In this regard, the semiconductor thin-film layer 104B shown in FIG. 14 may have corner portions having curved shapes as those shown in FIGS. 12 and 13.

While the preferred embodiments of the present invention have been illustrated in detail, it should be apparent that modifications and improvements may be made to the invention without departing from the spirit and scope of the invention as described in the following claims.

What is claimed is:

1. A composite element chip, comprising:
   a substrate; and
   a light emitting element array including a plurality of semiconductor thin-films disposed on the substrate and arranged in a predetermined direction which defines a first direction, each semiconductor thin-film of the plurality of semiconductor thin-films including a plurality of light emitting portions which are arranged so that adjacent light emitting portions are displaced from each other by a predetermined distance in a second direction which is perpendicular to the first direction, the plurality of light emitting portions being arranged along an imaginary line,
   wherein the plurality of light emitting portions are arranged in a direction inclined with respect to the first direction,
   wherein each semiconductor thin-film of the plurality of semiconductor thin-films has a first end that is parallel to the second direction; and a second end that extends along a pattern in which the plurality of light emitting portions are arranged and is parallel to the imaginary line, and
   wherein the first ends of adjacent semiconductor thin films face one another and are displaced from each other in the second direction.

2. The composite element chip according to claim 1, wherein the plurality of light emitting portions are arranged in a saw-tooth pattern so that every predetermined number of light emitting portions are arranged along a line which is inclined with respect to the first direction, the saw-tooth pattern including a plurality of the lines, and
   wherein each semiconductor thin-film of the plurality of semiconductor thin-films has an outer shape along the saw-tooth pattern in which the plurality of light emitting portions are arranged.

3. The composite element chip according to claim 2, wherein each semiconductor thin-film of the plurality of semiconductor thin-films has an outer shape including a corner portion having a curved shape.

4. The composite element chip according to claim 1, wherein each semiconductor thin-film of the plurality of semiconductor thin-films has an outer shape that is a parallelogram having two long sides parallel to the direction in which the plurality of light emitting portions are arranged.

5. The composite element chip according to claim 1, wherein the substrate is a semiconductor substrate and includes an integrated circuit for driving the plurality of light emitting portions.

6. A method of manufacturing the composite element chip according to claim 5, the method comprising:
    forming the plurality of semiconductor thin-films on a semiconductor material substrate;
    separating the plurality of semiconductor thin-films from the semiconductor material substrate, and
    bonding the plurality of semiconductor thin-films, after the separation of the plurality of thin-films, to a surface of the substrate that includes the integrated circuit.

7. A printing head comprising the composite element chip according to claim 1.

8. An image forming apparatus comprising:
    a latent image bearing body;
    the printing head according to claim 7 configured to expose a surface of the latent image bearing body to form a latent image;
    a developing unit that develops the latent image to form a developed image; and
    a transfer unit that transfers the developed image to a medium.

9. The composite element chip according to claim 1, wherein each semiconductor thin-film of the plurality of semiconductor thin-films has an outer shape including a corner portion having a curved shape.

10. The composite element chip according to claim 1, wherein the substrate is a semiconductor substrate, and wherein the plurality of semiconductor thin-films is formed by being epitaxially grown on a semiconductor material substrate prior to being separated from the semiconductor material substrate and being bonded to the substrate of the composite element chip.

* * * * *